(12) United States Patent
Mangold

(10) Patent No.: US 7,977,851 B2
(45) Date of Patent: Jul. 12, 2011

(54) PUSH BUTTON SWITCH

(75) Inventor: Harald Mangold, Lippach (DE)

(73) Assignee: Diehl Ako Stiftung & Co., KG, Wangen (DE)

( * ) Notice: Subject to any disclaimer, the term of this patent is extended or adjusted under 35 U.S.C. 154(b) by 243 days.

(21) Appl. No.: 12/438,584

(22) PCT Filed: Aug. 28, 2007

(86) PCT No.: PCT/EP2007/007500
§ 371 (c)(1),
(2), (4) Date: Feb. 24, 2009

(87) PCT Pub. No.: WO2008/028577
PCT Pub. Date: Mar. 13, 2008

(65) Prior Publication Data
US 2010/0013355 A1 Jan. 21, 2010

(30) Foreign Application Priority Data
Sep. 2, 2006 (DE) .......................... 10 2006 041 226

(51) Int. Cl.
*H01L 41/08* (2006.01)
(52) U.S. Cl. ........................................ 310/338; 310/319

(58) Field of Classification Search .................. 310/319, 310/331–332, 338, 365, 330; H01L 41/113, H01L 41/08
See application file for complete search history.

(56) References Cited

U.S. PATENT DOCUMENTS

| 4,328,441 A | * | 5/1982 | Kroeger et al. | ................ 310/319 |
| 5,231,326 A | * | 7/1993 | Echols | ........................ 310/338 |

FOREIGN PATENT DOCUMENTS

| DE | 19517141 | 11/1995 |
| DE | 102005006666 | 8/2006 |
| EP | 1338879 | 8/2004 |
| WO | WO 2004/023571 | 3/2004 |

* cited by examiner

*Primary Examiner* — Walter Benson
*Assistant Examiner* — Karen Addison
(74) *Attorney, Agent, or Firm* — Scully, Scott, Murphy & Presser, P.C.

(57) ABSTRACT

A push button switch including a piezoelectric element (10) which is arranged between a first electrode (16) and a second electrode (18) in such a manner that, when a pressure is exerted on the piezoelectric element, an electric voltage is generated between the first and the second electrode (16, 18). The voltage generated between the first and the second electrode (16, 18) of the piezoelectric element (10) is amplified via a suitable amplifier circuit (20) and supplied, for example, to a controller of an operating device of an electronic domestic appliance.

6 Claims, 3 Drawing Sheets

PUSH BUTTON SWITCH

BACKGROUND OF THE INVENTION

The present invention relates to a push button switch comprising a piezoelectric element which can be used, for example, in an operating device for an electronic domestic appliance.

CROSS-REFERENCE TO RELATED APPLICATIONS

This application is based on PCT Application No. PCT/EP2007/007500, filed on Aug. 28, 2007, which claims priority under the International Convention of Gelman Patent Application No. 102006041226.5, filed on Sep. 2, 2006.

Such a push button switch is basically constructed as shown in FIG. 1. For example, the piezoelectric element 10 is arranged behind an operating front plate of an electronic domestic appliance and supported on a fixed base 14. Furthermore, the piezoelectric element 10 is arranged between a first electrode 16 and a second electrode 18 so that, when a pressure or a force F is exerted by a finger 19 in the operating direction indicated in FIG. 1 a charge Q which is proportional to the force F exerted is released at the two electrodes 16, 18. An actuation of the push button switch can thus be determined by measuring this charge Q, the necessary actuating distance being very small.

Using such push button switches has some advantages in comparison with conventional button switches. Due to the minimal actuating distances, mechanically moving parts do not wear, and a simple and mechanically robust design of the button switch is possible. Furthermore, the operating front plates of the electronic domestic appliances do not require any openings or elevations or indentations which is why the button switch is arranged to be moisture-tight and the operating front plate can be cleaned in a simple manner.

DESCRIPTION OF THE PRIOR ART

A push button switch of this type comprising a piezoelectric element is described, for example, in EP 0 553 881 B1.

SUMMARY OF THE INVENTION

The invention is based on the object of developing a push button switch of the type described above, comprising a piezoelectric element in such a manner that better processing of the generated measurement signal is made possible.

This object is achieved by a push button switch which includes a piezoelectric element arranged between a first electrode and a second electrode such that, when a pressure is exerted on the piezoelectric element, an electrical voltage is generated between the first and second electrodes. Advantageous embodiments and developments of the invention are the subject matter of the dependent claims.

The push button switch according to the invention has a piezoelectric element which is arranged between a first electrode and a second electrode in such a manner that, when a pressure is exerted on the piezoelectric element, an electrical voltage is generated between the first and the second electrode, and an amplifier circuit, the first input of which is connected to the first electrode of the piezoelectric element and the second input of which is connected to the second electrode of the piezoelectric element. The amplifier circuit is operated by means of a voltage source and at its output an amplified voltage is generated as measurement signal between the first and the second electrode of the piezoelectric element. Between one of the first and the second electrodes of the piezoelectric element and a reference point of the voltage source of the amplifier circuit, an additional voltage source is also connected, the operating voltage of which is greater than the maximum voltage between the first and the second electrode of the piezoelectric element.

Since the voltage generated between the first and the second electrode of the piezoelectric element is output as an amplified measurement signal by means of the amplifier circuit, this measurement signal can be processed more easily, in principle. By providing the additional voltage source, a positive voltage exclusively occurs at any time both at the two inputs and at the output of the amplifier circuit which also facilitates the processing of the generated measurement signal.

In a preferred embodiment of the invention, the operating voltage of the additional voltage source is selected to be approximately as half as great as an operating voltage of the voltage source of the amplifier circuit. In this manner, the quiescent level of the measurement signal at the output of the amplifier circuit is located approximately in the centre of the dynamic range.

The push button switch of the design described above is used, for example, in an operating device, particularly an operating device for an electronic domestic appliance which is additionally provided with a controller having at least one A/D input connection which is connected to the output of the amplifier circuit of the at least one push button switch.

In one embodiment of the invention, the outputs of the amplifier circuits of several push button switches can also be connected to an A/D input connection of the controller via an analog multiplexer circuit.

BRIEF DESCRIPTION OF THE DRAWINGS

The above and further features and advantages of the invention will become more comprehensible from the following description of preferred, non-restrictive illustrative embodiments, referring to the attached drawings in which.

DETAILED DESCRIPTION OF THE INVENTION

The push button switch of the present invention, described with reference to the attached drawings in the text which follows, can be advantageously used in operating devices, particularly in operating devices of electronic domestic appliances (stoves, hobs, washing machines, driers, dishwashers etc.) without the invention being restricted to these applications.

Figure 1:
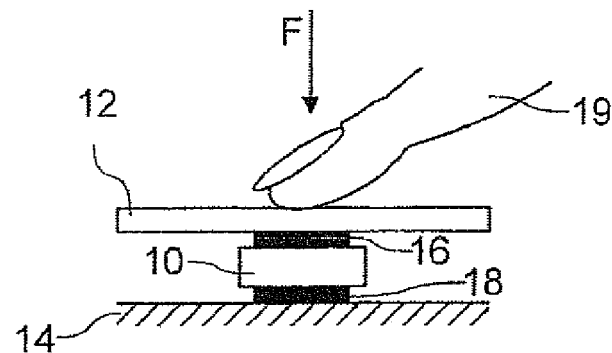
FIG. 1 shows a schematic representation of the mechanical structure of a push button switch according to the present invention.

The mechanical structure of the push button switch essentially corresponds to that of a conventional push button switch with piezoelectric element. As shown in FIG. 1, a piezoelectric element 10 is arranged behind an operating front plate 12 of an operating device, for example a glass ceramic hob, and supported on a fixed base 14. In this arrangement, the piezoelectric element 10 is accommodated sandwiched between a first electrode 16 on the side of the operating front plate 12 and a second electrode 18 on the side of the fixed base 18.

Figure 2:
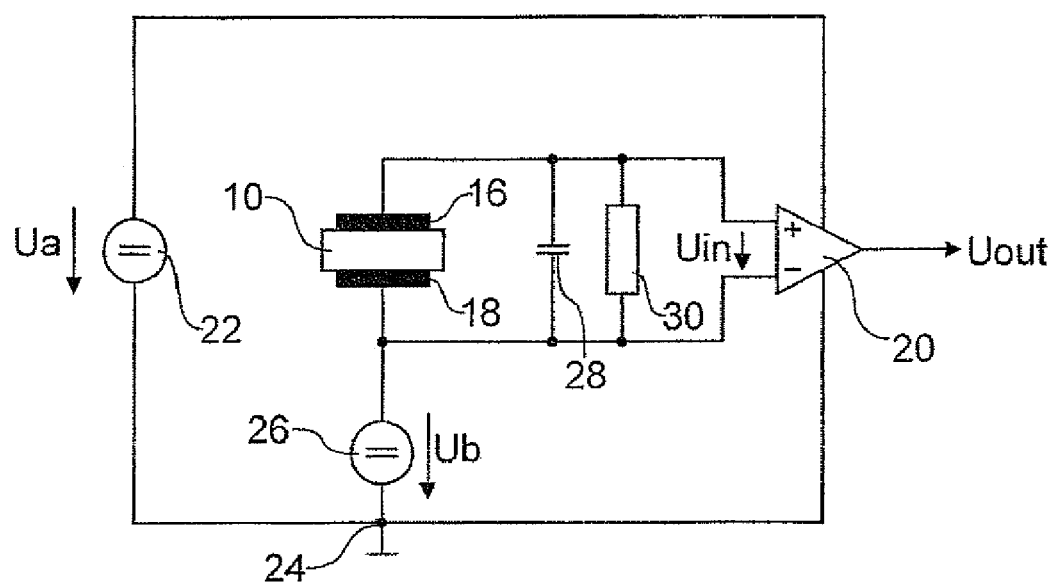
FIG. 2 shows a schematic block diagram of the structure of a push button switch according to a first illustrative embodiment of the present invention.

The structure and the operation of a first illustrative embodiment of the push button switch of the invention will now be explained in greater detail with reference to FIGS. 2 and 3.

If a force F acts on the piezoelectric element 10 in the actuating direction indicated in FIG. 1, for example by means of a finger 19, a charge quantity Q proportional to the force F is released at the two electrodes 16, 18. A voltage Uin is thus produced via the parasitic or real components of the capacitance (capacitance of the piezoelectric element etc.) 28, connected in parallel with the piezoelectric element 10, and the resistance (input resistance of the subsequent amplifier, insulation resistance of the piezoelectric element etc.) 30.

This voltage Uin is amplified by an amplifier circuit 20, the first input (+) of which is connected to the first electrode 16 and the second input (−) of which is connected to the second electrode 18 and which is supplied with an operating voltage Ua via a voltage source 22. The amplifier circuit 20 outputs at its output a correspondingly amplified measurement signal Uout for processing and evaluation, for example to an A/D input connection of a controller (microprocessor) 36. The measurement signal Uout is then evaluated by corresponding software.

However, due to the resistance 30, the voltage Uin between the two electrodes 16, 18 of the piezoelectric element 10 goes back to zero after a time constant determined by the capacitance 28 and the resistance 30 even if a force F is still exerted on the piezoelectric element 10. If the force F is then no longer present at a later time, the same charge quantity Q is now accepted again to the same extent as the charge quantity Q has been previously released. This leads to a voltage being generated again between the two electrodes 16, 18, but with the opposite polarity. Thus, both positive and negative voltages can occur between the two electrodes 16, 18.

Figure 3:
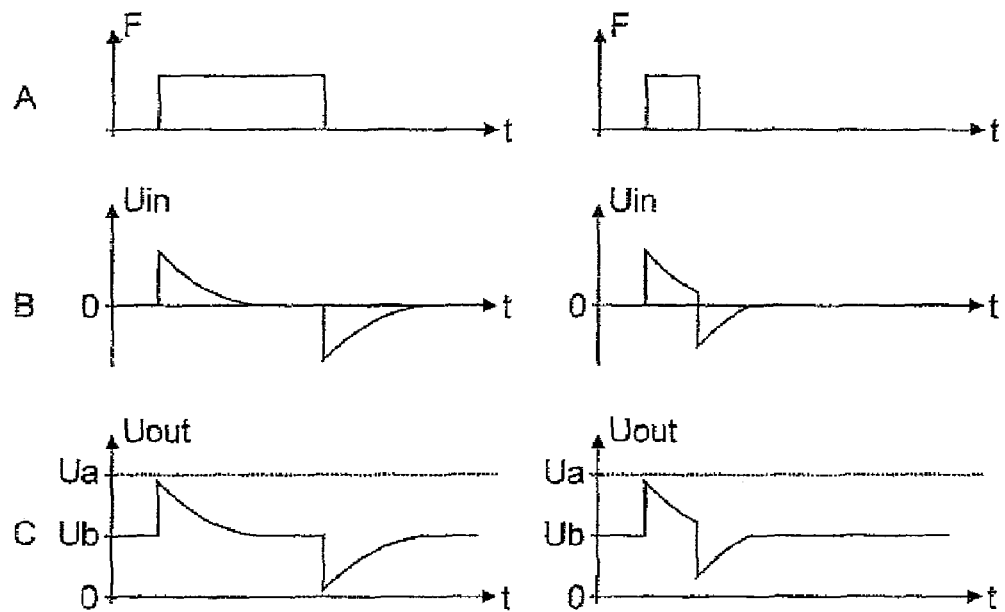
FIGS. 3A to C show schematic timing diagrams of an exerted force (F), a voltage (Uin) generated by the electrodes and of a measurement signal (Uout) for explaining the operation of the push button switch of FIG. 2.

This is shown more clearly by the timing diagrams of FIGS. 3A and 3B. The two representations in A in each case show the variation with time of a force F exerted on the piezoelectric element 10 of the push button switch; and the representations in B in each case show the variation in time of the voltage Uin generated between the two electrodes 16, 18 of the piezoelectric element 10. In the representations of FIG. 3, the case for a relatively long constant pressure on the button is shown on the left in each case whilst the case of a relatively short constant pressure on the button is illustrated on the right.

However, in addition to the voltage source 22 for supplying the amplifier circuit 20 with the operating voltage Ua, an additional voltage source 26 is also placed between the second electrode 18 of the piezoelectric element 10 and the reference point 24 of the voltage source 22 of the amplifier circuit 20. When the operating voltage Ub of this additional voltage source 26 is greater than the maximum voltage between the two electrodes 16, 18 of the piezoelectric element 10, only positive voltages occur both at the two inputs and at the output of the amplifier circuit 20 with respect to the reference point 24. This allows for a simpler amplification of the voltage Uin by the amplifier circuit 20 and a simpler evaluation of the measurement signal Uout at the output of the amplifier circuit 20.

If the operating voltage Ub of the additional voltage source 26 is about half as great as the operating voltage Ua of the voltage source 22 for the amplifier circuit 20, the quiescent level of the measurement signal Uout at the output of the amplifier circuit 20 is approximately in the centre of the dynamic range as illustrated in the representations of FIG. 3C.

Figure 4:
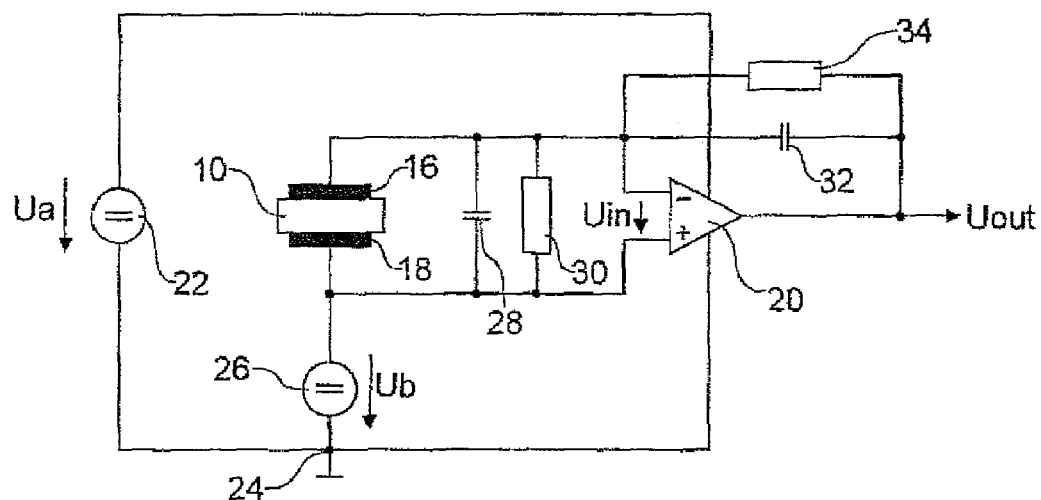
FIG. 4 shows a schematic block diagram of the structure of a push button switch according to a second illustrative embodiment of the present invention.
Figure 5:
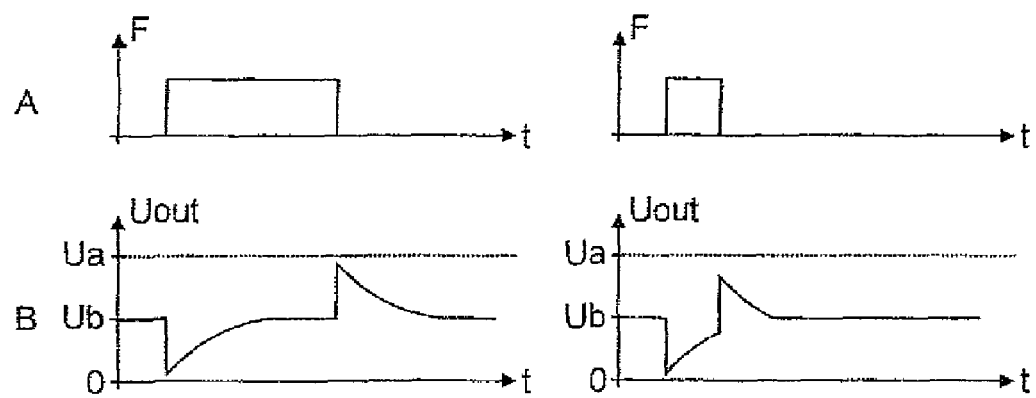
FIGS. 5A and B show schematic timing diagrams of an exerted force (F) or of a measurement signal (Uout) for explaining the operation of the push button switch of FIG. 4.

Referring to FIGS. 4 and 5, the structure and the operation of a second illustrative embodiment of the push button switch of the invention will now be explained in greater detail.

Whilst the charge amplifier of the push button switch of the first illustrative embodiment described above is provided with a relatively large input impedance, FIG. 4 shows the circuit configuration of a push button switch of the invention for a charge amplifier having a relatively low input impedance.

In this case, the charge amplifier is constructed of the amplifier circuit 20 and a capacitance 32 connected in parallel with the former. The charge quantity Q leaking away via the parasitic or real components of the capacitance 28 and of the resistance 30, connected in parallel with the piezoelectric element, can be neglected due to the virtual short circuit at the input of the amplifier circuit 20 (with a low input impedance) and the resultant very low voltage.

However, even if a force F continues to be exerted, the voltage at the output of the charge amplifier (20 and 32) goes back to zero due to the parasitic or real resistance 34 after a time constant determined by the capacitance 32 and the resistance 34. If the exertion of force F is then ended, this leads to a voltage at the output of the amplifier circuit 20 with reverse polarity analogously to the above statements in conjunction with the first illustrative embodiment, so that positive and negative measurement signals Uout can also occur in this case.

Analogously to the first above illustrative embodiment, therefore, an additional voltage source 26 is also placed between the second electrode 18 of the piezoelectric element 10 and the reference point 24 of the voltage source 22 of the amplifier circuit 20 in the circuit structure of FIG. 4. As a result, only positive voltages occur at the output of the amplifier circuit 20 with respect to the reference point 24. Here, too, the operating voltage Ub of the additional voltage source 26 is preferably about half as great as the operating voltage Ua of the voltage source 22 for the amplifier circuit 20 so that the quiescent level of the measurement signal Uout at the output of the charge amplifier 20, 32 is approximately in the centre of the dynamic range.

The operation of the push button switch of the second illustrative embodiment is illustrated further in FIGS. 5A and B. Representations A in each case show the variation of a force F, exerted on the piezoelectric element 10, over time t and the representations B in each case show the variation with time of the measurement signal Uout at the output of the charge amplifier 20, 32 for the case of Ub=½ Ua. As in the first illustrative embodiment, the case for a relatively long constant pressure on the button is illustrated in each case on the left and the case for a relatively short constant pressure on the button is illustrated on the right in this case, too.

Figure 6:
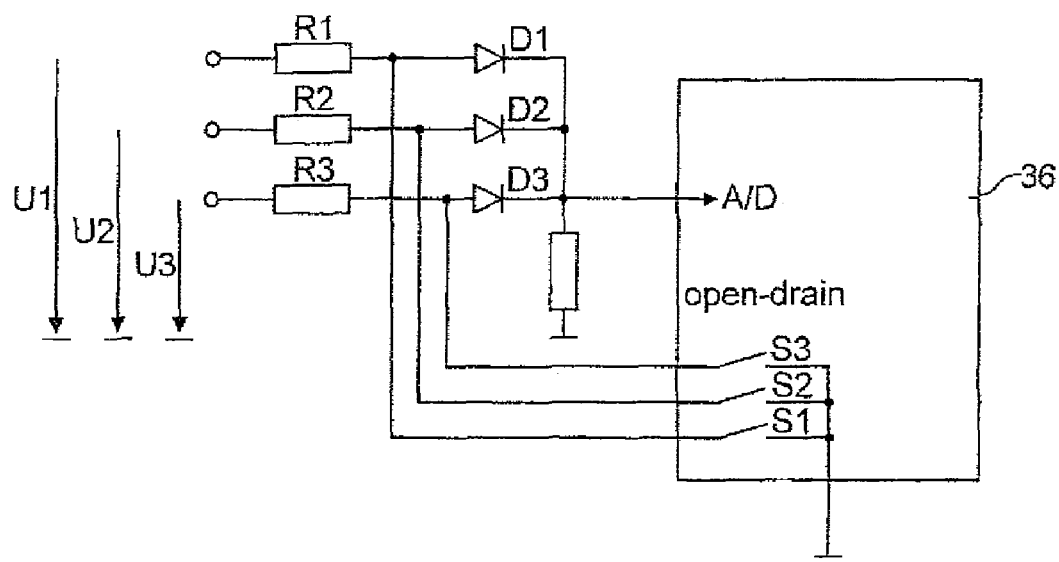
FIG. 6 shows a schematic block diagram of a controller with an analog multiplexer circuit for processing the measurement signals of several push button switches of the invention.

The measurement signal Uout of the amplifier circuit 20 (FIG. 2) or of the charge amplifier (FIG. 4) formed of amplifier circuit 20 and capacitance 32, respectively, is supplied, for example, to an A/D input connection of a controller (e.g. microprocessor) 36 and evaluated with corresponding software. If several push button switches or piezoelectric elements 10 are to be evaluated by a controller 36 but the controller does not have a sufficient number of A/D input connections, several analog measurement signals Uout from different piezoelectric elements 10 must be connected to one A/D input connection of the controller by means of a multiplexer circuit. This case is illustrated schematically in the circuit diagram of FIG. 6.

The analog measurement signals Uout of three different push button switches of the design described above are designated by U1, U2, U3. These analog measurement signals U1, U2, U3 are in each case applied to a common A/D input connection of the controller 36 via a resistor R1, R2, R3 and a diode D1, D2, D3. A voltage divider R1/R4, R2/R4 and R3/R4 is in each case formed via a common resistance R4.

The signal lines of the three analog measurement signals U1, U2, U3 are also connected in each case to an open-drain output S1, S2 and S3, respectively, of the controller 36 which, in turn, are connected to earth. If, for example, the analog measurement signal U1 is to be supplied to the controller 36, the open-drain outputs S2 and S3 of the controller 36 must be connected to earth. As a result, the anodes D2 and D3 are short circuited to earth by the open-drain outputs S2 and S3 via the resistances R2 and R3. The diodes D2 and D3 thus become cut off and prevent the measurement signals U2 and U3 at the resistance R4 from becoming superimposed on the measurement signal U1 which is currently to be evaluated.

In this switching state, the analog measurement signal U1AD reduced by the forward voltage UD1 of the diode D1 and by the voltage divider R1/R4 is present at the A/D input connection of the controller 36:

$$U1_{AD} = (U1 - U_{D1})R4/(R1+R4)$$

The other two analog measurement signals U2 and U3 are evaluated analogously.

In the push button switch according to the invention as has been described above by means of two preferred illustrative embodiments, referring to the attached drawings, a measurement signal Uout having a positive voltage level is always generated at the output of the charge amplifier, i.e. the amplifier circuit 20. This considerably simplifies the processing and evaluation of the measurement signals. At the same time, the push button switch of the invention makes use of the advantages, mentioned initially, of a push button switch having a piezoelectric element which is why it can be used particularly advantageously for an operating device of an electronic domestic appliance.

LIST OF REFERENCE NUMBERS

10 Piezoelectric element
12 Operating front plate
14 Fixed base
16 First electrode
18 Second electrode
19 Finger
20 Amplifier circuit
22 Voltage source
24 Reference point of 22
26 Additional voltage source
28 Capacitance
30 Resistance
32 Capacitance
34 Resistance
36 Controller

The invention claimed is:

1. Push button switch comprising:
a piezoelectric element (10) which is arranged between a first electrode (16) and a second electrode (18) such that, when a pressure is exerted on the piezoelectric element, an electrical voltage is generated between the first and the second electrode (16, 18), wherein an amplifier circuit (20) has a first input which is connected to the first electrode (16) of the piezoelectric element (10) and a second input which is connected to the second electrode (18) of the piezoelectric element (10);
the amplifier circuit (20) is operated by a voltage source (22) and generates at the output thereof an amplified voltage between the first and the second electrode of the piezoelectric element as a measurement signal (Uout); and
connected between one of the first and the second electrodes (16, 28) of the piezoelectric element (10) and a reference point (24) of the voltage source (22) of the amplifier circuit (20) is an additional voltage source (26) having an operating voltage (Ub) which is greater than the maximum voltage between the first and the second electrode (16, 18) of the piezoelectric element (10).

2. Push button switch according to claim 1, wherein the operating voltage (Ub) of the additional voltage source (26) is selected to be approximately half as great as an operating voltage (Ua) of the voltage source (22) of the amplifier circuit (20)

3. Operating device comprising at least one push button switch according to claim 1 or 2, wherein a controller (36) has at least one A/D input connection which is connected to the output of the amplifier circuit (20) of the push button switch.

4. Operating device according to claim 3, wherein the outputs of the amplifier circuits (20) of several said push button switches are connected to an A/D input connection of the controller (36) via an analog multiplexer circuit.

5. The use of an operating device according to claim 3 for an electronic domestic appliance.

6. The use of an operating device according to claim 4 for an electronic domestic appliance.

* * * * *